(12) United States Patent
Günther

(10) Patent No.: US 11,719,723 B2
(45) Date of Patent: Aug. 8, 2023

(54) SIGNAL POST-PROCESSING METHOD, SIGNAL POST-PROCESSING CIRCUIT AND OSCILLOSCOPE

(71) Applicant: Rohde & Schwarz GmbH & Co. KG, Munich (DE)

(72) Inventor: Thomas Günther, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 788 days.

(21) Appl. No.: 16/223,517

(22) Filed: Dec. 18, 2018

(65) Prior Publication Data
US 2019/0195915 A1 Jun. 27, 2019

(30) Foreign Application Priority Data
Dec. 22, 2017 (EP) .................................... 17210429

(51) Int. Cl.
*G01R 13/02* (2006.01)
*G01R 23/16* (2006.01)

(52) U.S. Cl.
CPC ............ *G01R 13/029* (2013.01); *G01R 23/16* (2013.01)

(58) Field of Classification Search
CPC .... G01R 23/16; G01R 23/165; G01R 23/167; G01R 13/029
See application file for complete search history.

(56) References Cited

U.S. PATENT DOCUMENTS

| | | | | |
|---|---|---|---|---|
| 5,038,097 A * | 8/1991 | Imanaka | ................. | G01R 23/16 324/76.24 |
| 5,485,395 A | 1/1996 | Smith | | |
| 5,706,202 A | 1/1998 | Itahara et al. | | |
| 5,929,838 A * | 7/1999 | Hall | ...................... | G01R 13/029 345/440.1 |
| 6,675,106 B1 * | 1/2004 | Keenan | ...................... | G01J 3/28 702/194 |
| 6,681,191 B1 * | 1/2004 | Pickerd | ................ | G01R 13/345 702/80 |
| 6,700,388 B1 | 3/2004 | Mayor et al. | | |
| 7,251,572 B1 * | 7/2007 | Draving | .................. | H04L 1/205 375/226 |

(Continued)

FOREIGN PATENT DOCUMENTS

CN 106446868 A 2/2017

OTHER PUBLICATIONS

Tektronix, Oscilloscope Basics Guide, https://www.newark.com/wcsstore/ExtendedSitesCatalogAssetStore/cms/asset/images/americas/common/storefront/tektronix/7136_Oscilloscope-Basics-Guide.pdf (Year: 2013).*

*Primary Examiner* — Michael J Dalbo
(74) *Attorney, Agent, or Firm* — Christensen O'Connor Johnson Kindness PLLC

(57) ABSTRACT

A signal post-processing method is described, wherein a time-and-value-discrete signal is read from a memory by a signal post-processing circuit wherein a resolution bandwidth and a frequency range of the time-and-value-discrete signal are predetermined. A window filter is applied to the time-and-value-discrete signal. The window filtered time-and-value-discrete signal is transformed to a full-bandwidth frequency-domain signal. A sub-band is selected from the full-bandwidth frequency-domain signal by a selection unit wherein the rest is discarded by the selection unit. Further, a signal post-processing circuit as well as an oscilloscope are described.

17 Claims, 2 Drawing Sheets

(56) References Cited

U.S. PATENT DOCUMENTS

| | | | |
|---|---|---|---|
| 8,521,460 B2 | 8/2013 | Dobyns | |
| 8,675,719 B2 | 3/2014 | Dobyns et al. | |
| 9,577,798 B1* | 2/2017 | Melis | H04L 5/0005 |
| 2009/0094495 A1* | 4/2009 | Torin | G01R 23/16 |
| | | | 714/732 |
| 2010/0204938 A1 | 8/2010 | Hillman, Jr. et al. | |
| 2014/0320145 A1* | 10/2014 | Johnson | G01R 13/0236 |
| | | | 324/436 |
| 2016/0112218 A1* | 4/2016 | Abe | H04L 27/38 |
| | | | 375/261 |
| 2018/0337727 A1* | 11/2018 | Yoshida | H04J 14/08 |

* cited by examiner

SIGNAL POST-PROCESSING METHOD, SIGNAL POST-PROCESSING CIRCUIT AND OSCILLOSCOPE

FIELD OF THE DISCLOSURE

Embodiments of the present disclosure generally relate to a signal post-processing method, a signal post-processing circuit as well as an oscilloscope.

BACKGROUND

The user of a test and measurement instrument such as an oscilloscope is interested in one or more specific parts of a frequency band of his signal. This part should be presented as good as possible for analyzing purposes. In addition, measurements, spectrogram and post-processing curves should also only be calculated for the parts being of interest. However, the source signal usually covers a larger frequency range than the user is interested in afterwards or the user cannot directly restrict the frequency data of the source signal.

Therefore, the user requires a possibility to select a certain frequency range.

Oscilloscopes are known that use the digital down-converter unit of a signal analyzing circuit for selecting a certain frequency range of the signal while acquiring the respective data and storing the data in the acquisition memory. Once the frequency range has been selected at this stage, it remains constant. Accordingly, it is not possible to select a certain frequency range of the data stored in the acquisition memory when accessing this data.

Using a digital down converter unit when accessing the data of the acquisition memory requires a lot of resources and complicates the appropriate calculations to be done.

Moreover, a digital down converter unit is always required for pre-selecting or post-selecting a certain frequency range.

Particularly, the pre-selecting results in data stored in the acquisition memory that has a predetermined resolution bandwidth and frequency range. Thus, the user has to know the area or rather portion of interest when acquiring the data since the predetermined resolution bandwidth and frequency range are fix and cannot be varied anymore at a later stage.

Accordingly, there is a need for a simple and variable possibility to select the data being of interest for the user.

SUMMARY

Embodiments of the present disclosure provide a signal post-processing method, comprising the following steps:

Reading a time-and-value-discrete signal from a memory by a signal post-processing circuit, wherein a resolution bandwidth and a frequency range of the time-and-value-discrete signal are predetermined;

Applying a window filter to the time-and-value-discrete signal;

Transforming the window filtered time-and-value-discrete signal to a full-bandwidth frequency-domain signal; and Selecting a sub-band from the full-bandwidth frequency-domain signal and discarding the rest by a selection unit.

Further, embodiments of the present disclosure provide a signal post-processing circuit for a test and measurement instrument, comprising:

a reader unit configured to read a time-and-value-discrete signal from a memory;

a filter unit coupled to the reader unit and configured to apply a window filter to the time-and-value-discrete signal read out from the memory;

a transform unit located downstream of the filter unit and configured to transform the filtered time-and-value-discrete signal to a full-bandwidth frequency-domain signal;

and a selection unit coupled to the transform unit and configured to select a sub-band from the full-bandwidth frequency-domain signal and discard the rest of the full-bandwidth frequency-domain signal.

The present disclosure is based on the idea to set a virtual center frequency and a virtual frequency span by selecting a certain range of the full-bandwidth frequency-domain signal such that the acquired resolution bandwidth and frequency range are maintained without any changes. The virtual frequency span selected is a sub-band of the whole frequency range provided by the acquired data. Thus, the area to be analyzed can be limited to the area being of interest in a simple manner after the data has been acquired. The user is, therefore, more flexible with regard to the analysis of the data.

As the acquired data remain unchanged, more than one sub-band can be analyzed, for example two different sub-bands can be selected appropriately by setting the selection unit in a desired manner. Thus, harmonics can be analyzed.

In addition, it is possible to analyze the data even though the signal source has changed as the respective data may be stored in the memory.

In some embodiments, the window filter applied may be a rectangular filter having a filter coefficient of 1.

In general, the predetermined resolution bandwidth corresponds to a fix resolution bandwidth such that the total number of the time-and-value-discrete signal values is predetermined. In a similar manner, the predetermined frequency range is predetermined by the time distance between two successive time-and-value-discrete signal values, namely the reciprocal sample rate.

The source signal provided is defined by its maximum frequency range during recording and the recording time in the resolution bandwidth. Afterwards, a virtual center frequency and a virtual frequency span are defined for limiting the area to be analyzed to the one being of interest.

The time-and-value-discrete signal relates to a time-discrete signal (also called discrete-time signal), namely signal points at equidistant times or a time series consisting of a sequence of quantities, as well as a value-discrete signal such as a digital signal.

As no digital down-converter is required, and in some embodiments is omitted in its entirety, the post-processing circuit can be established in a more cost-efficient manner. In a similar manner, the method can be performed in a cost-efficient manner.

Hence, the memory may be an acquisition memory.

Generally, the selected sub-band may be outputted. Thus, an output interface is provided that is connected with the selection unit. Optionally, a post-processing unit is interposed between the output interface and the selection unit so that the selected sub-band is post-processed previously.

For instance, analyses on the selected sub-band may be done such as minimum, maximum and/or average analyses. Furthermore, the post-processor may provide measurements, spectrograms, marker and/or mask tests.

Thus, it becomes obvious that the time-and-value-discrete signal read out from the acquisition memory and processed as described above is used for outputting and/or displaying purposes rather than for triggering, namely generating a trigger signal, for instance a trigger signal of a frequency mask trigger.

The selected sub-band is processed further, namely the frequency-domain signal in the respective sub-band. In contrast thereto, a trigger signal is a binary signal, namely "true" or "false".

According to an aspect, a zero padding is applied to the time-and-value-discrete signal prior to the transforming step and/or after the window filter is applied. The zero padding is done by adding zeros to the end of a time domain signal, namely the time-and-value-discrete signal. In some embodiments, the zeros are added to a certain portion of the time domain signal being of interest. The zero padding corresponds to an interpolation in the frequency domain. In general, it ensures that a high frequency resolution is enforced by improving the frequency resolution at the predetermined resolution bandwidth. Hence, the area being of interest can be used for further processing.

Accordingly, mask tests, marker, minimum, maximum, hold and/or average analyses are performed for the area or rather part being of interest rather than the whole signal (full-bandwidth frequency-domain signal). Thus, measurements as well as spectrographs are obtained for this respective area or rather part.

According to another aspect, the step of applying the window filter, the transforming step and/or the selecting step are/is controlled based on frequency domain settings and/or time domain settings. A controller is provided that controls the different sub-units of the signal post-processing circuit appropriately.

An embodiment provides that the sub-band comprises a center frequency and a frequency span around the center frequency. This center frequency is set during the selection step. In a similar manner, the frequency span is defined by the selection unit which is controlled by the controller.

For instance, the memory comprises an oscilloscope acquisition memory or a spectrum analyzer acquisition memory. Accordingly, the signal post-processing circuit may be used in an oscilloscope or rather a spectrum analyzer. In a similar manner, the method can be implemented by an oscilloscope or rather a spectrum analyzer.

In some embodiments, several sub-bands are selected from the same time-and-value-discrete signal. As already mentioned above, different virtual center frequencies and frequency spans may be selected from the same data source being stored in the respective memory.

According to an aspect, a controller is provided that is connected with the reader unit, the filter unit, the transform unit and/or the selection unit. The controller ensures proper operation of the signal post-processing circuit.

According to another aspect, the controller is configured to receive time domain settings and frequency domain settings and/or wherein the controller is configured to control the reader unit, the filter unit, the transform unit and/or the selection unit. The controller controls the respective settings of the units appropriately, for example based on the time domain settings and/or frequency domain settings received.

In some embodiments, the controller can be implemented in hardware or in software or in a combination of hardware and software. In one embodiment, the controller is implemented as a suitable programmed processor for carrying out its functionality and technology set forth herein.

An embodiment provides that a zero padding unit is provided that is configured to apply a zero padding. As discussed above, the zero padding unit improves the frequency resolution.

In some embodiments, the zero padding unit is located between the filter unit and the transform unit. For this purpose, the zero padding is applied prior to the transforming step done by the transform unit.

According to an embodiment, the signal post-processing circuit comprises field-programmable gate array, an application-specific integrated circuit and/or a digital signal processor. In some embodiments, the different units can be provided at least partly on a field-programmable gate array (FPGA), an application-specific integrated circuit (ASIC) or a digital signal processor (DSP) in a cost efficient manner.

Another aspect provides that the signal post-processing circuit is established by a field-programmable gate array, an application-specific integrated circuit and/or a digital signal processor. In some embodiments, the whole signal post-processing circuit is established by the respective FPGA, ASIC or DSP.

Further, embodiments of the present disclosure provide an oscilloscope comprising a signal post-processing circuit as mentioned above. The advantages mentioned above also apply for the oscilloscope in a similar manner.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

Figure 1:
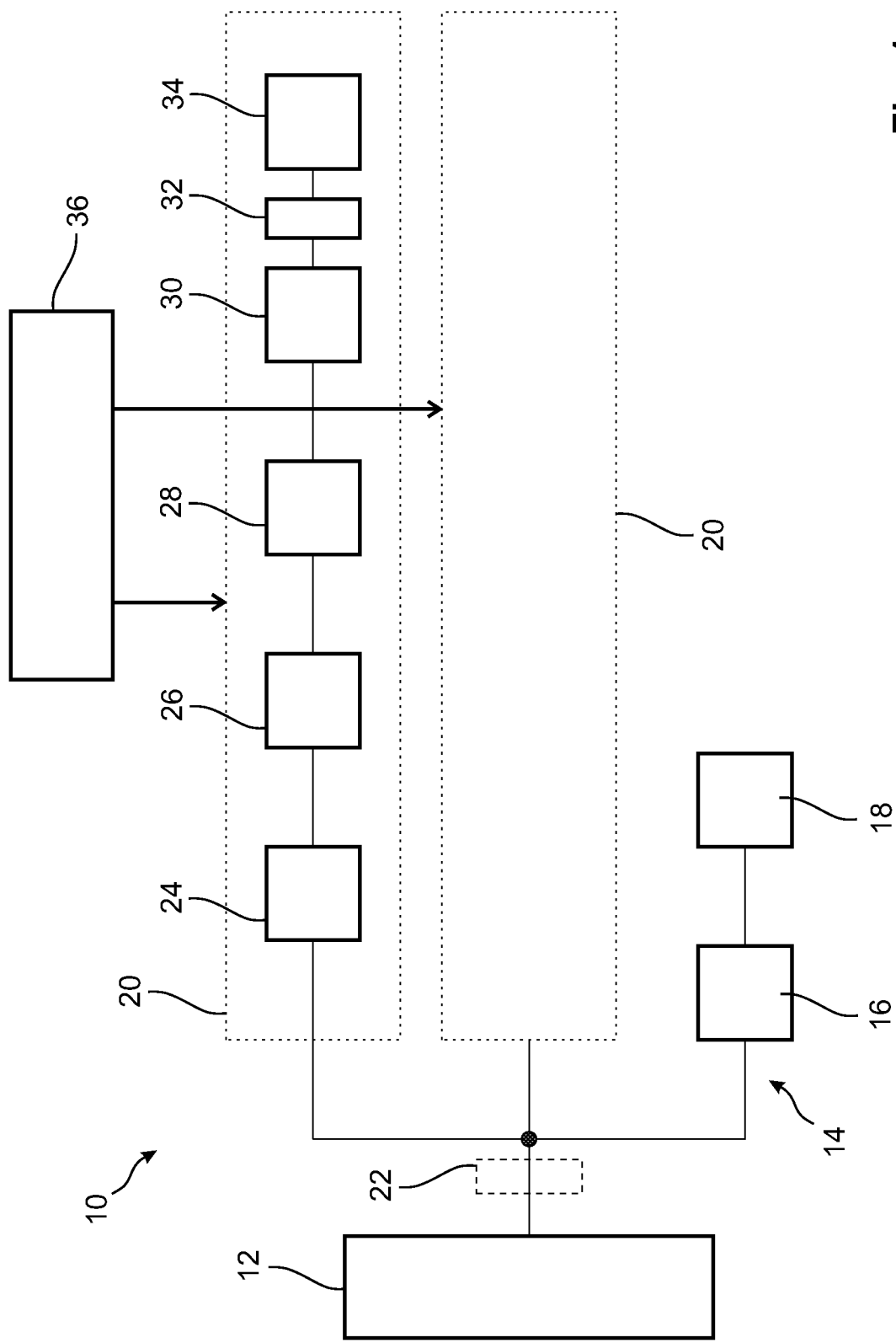
FIG. 1 shows an embodiment of a signal post-processing circuit according to an embodiment of the present disclosure.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. In FIG. 1, a signal post-processing circuit 10 is shown that is connected to a memory 12. In the shown embodiment, the memory 12 is an acquisition memory of an oscilloscope. However, the memory 12 may also be a spectrum analyzer acquisition memory.

In the shown embodiment, the signal post-processing circuit 10 has at least one time domain channel 14 comprising a post processing unit 16 and an output interface 18 for the time domain. In addition, the signal post-processing circuit 10 has several frequency domain channels 20 wherein only one is shown in more detail hereinafter.

A reader unit 22 is provided that is assigned to the several channels 14, 20. Alternatively, each channel 14, 20 has its own reader unit for reading the respective data from the memory 12.

The frequency domain channel 20 comprises a filter unit 24 that applies a window filter on the data read from the memory 12 by the reader unit 22 wherein the data relates to a time-and-value-discrete signal. The filter unit 24 is coupled to a zero padding unit 26 that applies a zero padding on the respective time-and-value-discrete signal obtained.

The window filtered (and zero padded) time-and-value-discrete signal is then processed by a transform unit 28 that transform the respective signal from the time domain into the frequency domain. Hence, the window filtered (and zero padded) time-and-value-discrete signal is transformed to a full-bandwidth frequency-domain signal for further processing.

The full-bandwidth frequency-domain signal is forwarded to a selection unit 30 that selects a sub-band from the full-bandwidth frequency-domain signal and discards the rest of the full-bandwidth frequency-domain signal. The sub-band selected relates to the area or rather portion of the full-bandwidth frequency-domain signal being of interest for the user.

The selected sub-band is then processed by a post-processor 32 and forwarded to an output interface 34 for the frequency domain. In the post-processor 32, analyses on the selected sub-band may be done such as minimum, maximum and/or average analyses.

Furthermore, the post-processor 32 may provide measurements, spectrograms, marker and/or mask tests.

The respective results are then forwarded to the post processing unit 16 for illustrating purposes.

The frequency domain channels 20, for example the respective units of each frequency domain channel 20, are assigned to a controller 36 that controls the respective units appropriately. Even though not shown in FIG. 1, the controller 36 may also control at least the post processing unit 16 of the time domain channel 14.

The controller 36 receives time domain settings and frequency domain settings for controlling purposes. Thus, the controller 36 controls the respective units based on the settings received.

As the several frequency domain channels 20 receive the respective data from the memory 12, it is possible that several different sub-bands are analyzed simultaneously.

In some embodiments, each frequency domain channel 20 limits the signals stored in the memory 12 to a desired center frequency and frequency span (sub-band) being of interest in a virtual manner while post-processing the signal(s) already acquired.

Therefore, different center frequencies and frequency spans may be investigated appropriately.

According to some embodiments, the signal post-processing circuit 10 comprises a field-programmable gate array (FPGA), an application-specific integrated circuit (ASIC) and/or a digital signal processor (DSP). Hence, at least components of the signal post-processing circuit 10 are established by the FPGA, ASIC and/or DSP. In some embodiments, the whole signal post-processing circuit 10 is established by the FPGA, ASIC and/or DSP.

For example, each block of any of the block diagrams, respectively, described herein and/or illustrated in the FIGURES, or any combination thereof, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the block diagrams and associated descriptions, etc., and/or carry out the methods described herein. The term computer can include any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

In some embodiments, one or more units of the signal post-processing circuit 10, the controller 36, etc., include one or more computing devices associated with a memory storing logic modules and/or instructions for carrying out the function(s) of the respective device and/or any of its sub-units, either separately or in any combination. In an embodiment, one or more units of the signal post-processing circuit 10, the controller 36, etc., includes combinations of circuits and computer program products having software or firmware instructions stored on one or more computer readable memories that work together to cause the power device to perform one or more methodologies or technologies described herein.

The signal post-processing circuit 10 is configured to perform a signal post-processing method wherein a time-and-value-discrete signal stored in the memory 12 is read from the memory 12 by the signal post-processing circuit 10, for example a reader unit 22. The resolution bandwidth and the frequency range of the time-and-value-discrete signal are predetermined, namely fix.

Then, a window filter is applied to the time-and-value-discrete signal via the filter unit 24. The filtered time-and-value-discrete signal may then processed by the zero padding unit 26 in order to improve the frequency resolution of the signal processed.

The filtered and (optionally zero padded) time-and-value-discrete signal is forwarded to the transform unit 28 which transforms the signal to a full-bandwidth frequency-domain signal. Accordingly, a signal in the frequency domain is provided firstly during the post-processing. Previously, only time domain signals were processed and stored appropriately.

The frequency-domain signal is received by the selection unit 30 that selects a certain sub-band from the full-bandwidth frequency-domain signal. In addition, the selection unit 30 discards the rest of the full-bandwidth frequency-domain signal such that only the portion or rather area of interest is used for further processing.

This selected sub-band is then forwarded to a post-processor 32 that performs analyses on the data received, namely the limited area of the overall signal. Thus, a virtual center frequency as well as a virtual frequency span of the input signal can be investigated appropriately.

After the post-processing, the signal and/or the results related thereto are forwarded to the output interface 34 to be outputted, for instance displayed.

Figure 2:
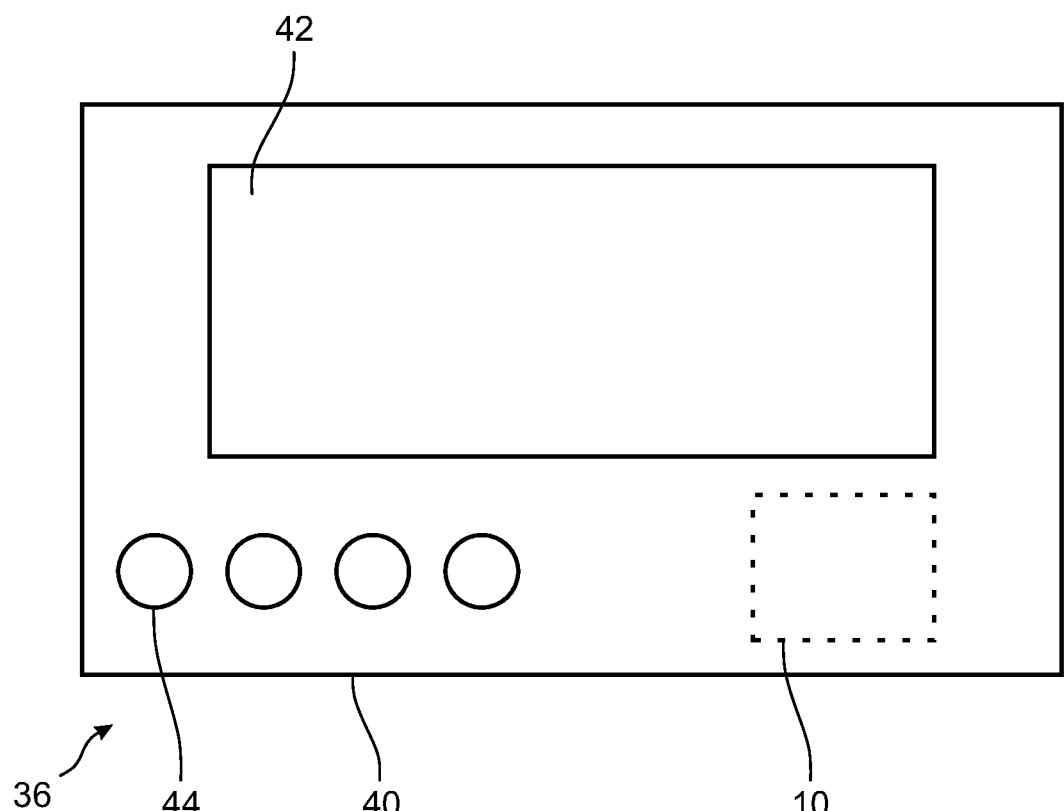
FIG. 2 shows an oscilloscope according to an embodiment of the present disclosure.

In FIG. 2, an oscilloscope 38 is shown having a housing 40 and a display 42 assigned to at least one side of the housing 40. Further, the oscilloscope 38 comprises several inputs 44 for receiving input signals to be recorded and acquired. As indicated in FIG. 2 by the dashed lines, the oscilloscope 38 has an integrated signal post-processing circuit 10 as described above.

The respective output interfaces 18, 34 may be connected to the display 42 such that the respective data provided at the output interfaces 18, 34 can be displayed on the display 42 for informing the user appropriately. Thus, the oscilloscope 38 as a test and measurement instrument can be used for performing the signal post-processing method. Alternatively, the signal post-processing circuit 10 may be integrated in a spectrum analyzer.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal post-processing method, comprising:
   reading a time-and-value-discrete signal from an acquisition memory by a reader circuit of a signal post-processing circuit, wherein a resolution bandwidth and a frequency range of the time-and-value-discrete signal are predetermined, resulting in a fix resolution bandwidth such that the total number of the time-and-value-discrete signal values is predetermined;
   applying a window filter to the time-and-value-discrete signal by a filter circuit of the signal post-processing circuit, which was read out from the acquisition memory;
   transforming the window filtered time-and-value-discrete signal to a full-bandwidth frequency-domain signal by a transform circuit of the signal post-processing circuit;
   applying a zero padding to the time-and-value-discrete signal prior to the transforming step, thereby enforcing a high frequency resolution since the frequency resolution is improved at the predetermined resolution bandwidth; and
   selecting a sub-band from the full-bandwidth frequency-domain signal and discarding the rest by a selection circuit of the signal post-processing circuit, wherein a virtual center frequency and a virtual frequency span are set by selecting a certain range of the full-bandwidth frequency-domain signal such that the acquired resolution bandwidth and frequency range are maintained without any changes, thereby limiting an area to be analyzed to an area of interest after data of the time-and-value-discrete signal has been acquired and stored in the acquisition memory, wherein the acquired data remains unchanged such that more than one sub-band can be analyzed.

2. The method according to claim 1, wherein at least one of the step of applying the window filter, the transforming step and the selecting step is controlled based on at least one of frequency domain settings and time domain settings.

3. The method according to claim 1, wherein the sub-band comprises a center frequency and a frequency span around the center frequency.

4. The method according to claim 1, wherein the acquisition memory is an oscilloscope acquisition memory or a spectrum analyzer acquisition memory.

5. The method according to claim 1, wherein several sub-bands are selected from the same time-and-value-discrete signal.

6. The signal post-processing method according to claim 1, wherein the frequency-domain signal in the respective sub-band is processed further in order to perform analyses on the selected sub-band.

7. A signal post-processing circuit for a test and measurement instrument, comprising:
   a reader circuit configured to read a time-and-value-discrete signal from an acquisition memory, wherein a resolution bandwidth and a frequency range of the time-and-value-discrete signal are predetermined, resulting in a fix resolution bandwidth such that the total number of the time-and-value-discrete signal values is predetermined;
   a filter circuit coupled to the reader circuit and configured to apply a window filter to the time-and-value-discrete signal read out from the memory;
   a transform circuit located downstream of the filter circuit and configured to transform the filtered time-and-value-discrete signal to a full-bandwidth frequency-domain signal;
   a zero padding circuit that is configured to apply a zero padding to the time-and-value-discrete signal prior to the transforming step, thereby enforcing a high frequency resolution since the frequency resolution is improved at the predetermined resolution bandwidth; and
   a selection circuit coupled to the transform circuit and configured to select a sub-band from the full-bandwidth frequency-domain signal and discard the rest of the full-bandwidth frequency-domain signal, wherein a virtual center frequency and a virtual frequency span are set by selecting a certain range of the full-bandwidth frequency-domain signal such that the acquired resolution bandwidth and frequency range are maintained without any changes, thereby limiting an area to be analyzed to an area of interest after data of the time-and-value-discrete signal has been acquired and stored in the acquisition memory, wherein the acquired data remains unchanged such that more than one sub-band can be analyzed.

8. The signal post-processing circuit according to claim 7, wherein a controller is provided that is connected with at least one of the reader circuit, the filter circuit, the transform circuit and the selection circuit.

9. The signal post-processing circuit according to claim 8, wherein the controller is configured to receive time domain settings and frequency domain settings.

10. The signal post-processing circuit according to claim 8, wherein the controller is configured to control at least one of the reader circuit, the filter circuit, the transform circuit and the selection circuit.

11. The signal post-processing circuit according to claim 7, wherein the zero padding circuit is located between the filter circuit and the transform circuit.

12. The signal post-processing circuit according to claim 7, wherein the acquisition memory is an oscilloscope acquisition memory or a spectrum analyzer acquisition memory.

13. The signal post-processing circuit according to claim 7, wherein the signal post-processing circuit comprises at least one of a field-programmable gate array, an application-specific integrated circuit and a digital signal processor.

14. The signal post-processing circuit according to claim 7, wherein the signal post-processing circuit is established by at least one of a field-programmable gate array, an application-specific integrated circuit and a digital signal processor.

15. The signal post-processing circuit according to claim 7, wherein the signal post-processing circuit is capable of processing further the frequency-domain signal in the respective sub-band in order to perform analyses on the selected sub-band.

16. A signal post-processing circuit for a test and measurement instrument, comprising:
- a reader circuit configured to read a time-and-value-discrete signal from an acquisition memory;
- a filter circuit coupled to the reader circuit and configured to apply a window filter to the time-and-value-discrete signal read out from the memory;
- a transform circuit located downstream of the filter circuit and configured to transform the filtered time-and-value-discrete signal to a full-bandwidth frequency-domain signal; and
- a selection circuit coupled to the transform circuit and configured to select a sub-band from the full-bandwidth frequency-domain signal and discard the rest of the full-bandwidth frequency-domain signal, wherein a virtual center frequency and a virtual frequency span are set by selecting a certain range of the full-bandwidth frequency-domain signal such that the acquired resolution bandwidth and frequency range are maintained without any changes, thereby limiting an area to be analyzed to an area of interest after data of the time-and-value-discrete signal has been acquired and stored in the acquisition memory, wherein the acquired data remains unchanged such that more than one sub-band can be analyzed,
- wherein the signal post-processing circuit is established by at least one of a field-programmable gate array, an application-specific integrated circuit and a digital signal processor, and
- wherein the signal post-processing circuit is capable of processing further the frequency-domain signal in the respective sub-band in order to perform analyses on the selected sub-band.

17. The signal post-processing circuit according to claim 16, wherein the selection circuit is capable of selecting two different sub-bands by setting the selection circuit.

* * * * *